United States Patent
Chung et al.

(10) Patent No.: US 6,919,243 B2
(45) Date of Patent: Jul. 19, 2005

(54) METHODS OF FORMING AN INTEGRATED CIRCUIT CAPACITOR IN WHICH A METAL PREPROCESSED LAYER IS FORMED ON AN ELECTRODE THEREOF

(75) Inventors: Jeong-hee Chung, Seoul (KR); In-sung Park, Seoul (KR); Jae-hyun Yeo, Incheon (KR)

(73) Assignee: Samsung Electronics Co., Ltd. (KR)

( * ) Notice: Subject to any disclaimer, the term of this patent is extended or adjusted under 35 U.S.C. 154(b) by 236 days.

(21) Appl. No.: 10/043,027

(22) Filed: Jan. 9, 2002

(65) Prior Publication Data

US 2002/0094634 A1 Jul. 18, 2002

(30) Foreign Application Priority Data

Jan. 18, 2001 (KR) .......................................... 2001-2960

(51) Int. Cl.⁷ .......................................... H01L 21/8242
(52) U.S. Cl. ...................................... 438/239; 438/240
(58) Field of Search .................. 436/240, 250, 436/253, 393, 399, 243, 396; 257/528, 532, 533

(56) References Cited

U.S. PATENT DOCUMENTS

| | | | | |
|---|---|---|---|---|
| 6,023,613 | A | * | 2/2000 | Kanehara .................. 455/165.1 |
| 6,207,489 | B1 | * | 3/2001 | Nam et al. ................... 438/240 |
| 6,218,260 | B1 | * | 4/2001 | Lee et al. .................... 438/398 |
| 6,372,598 | B2 | * | 4/2002 | Kang et al. .................. 438/399 |
| 6,376,299 | B1 | * | 4/2002 | Joo et al. ..................... 438/240 |
| 2001/0001501 | A1 | * | 5/2001 | Lee et al. .................... 257/534 |
| 2002/0006708 | A1 | * | 1/2002 | Kang et al. .................. 438/399 |
| 2002/0025628 | A1 | * | 2/2002 | Derderian et al. ........... 438/253 |
| 2002/0100959 | A1 | * | 8/2002 | Joe et al. ..................... 257/532 |

FOREIGN PATENT DOCUMENTS

KR    2000-27836    5/2000

OTHER PUBLICATIONS

Handbook of Chemical Vapor Deposition (CVD), Noyes Publications, Copyright 1992, Author : Hugh O. Pierson, pp. 234, Section 5.6.*
Notice to Submit Response, KR Application No. 10–2001–0002960, Oct. 31, 2002.

* cited by examiner

*Primary Examiner*—Carl Whitehead, Jr.
*Assistant Examiner*—William Vesperman
(74) *Attorney, Agent, or Firm*—Myers Bigel Sibley & Sajovec, P.A.

(57) ABSTRACT

An integrated circuit capacitor is manufactured by forming a lower electrode on a substrate and forming a metal preprocessed layer on the lower electrode using chemical vapor deposition in which a metal precursor is used as a source gas and the metal precursor comprises oxygen. A dielectric layer is then formed on the metal preprocessed layer and an upper electrode is formed on the dielectric layer. The metal preprocessed layer may reduce oxidation of the lower electrode due to oxygen supplied during formation of the dielectric layer.

21 Claims, 4 Drawing Sheets

METHODS OF FORMING AN INTEGRATED CIRCUIT CAPACITOR IN WHICH A METAL PREPROCESSED LAYER IS FORMED ON AN ELECTRODE THEREOF

RELATED APPLICATION

This application claims the benefit of Korean Patent Application No. 2001-2960, filed Jan. 18, 2001, the disclosure of which is hereby incorporated herein by reference.

FIELD OF THE INVENTION

The present invention relates generally to methods of manufacturing integrated circuit devices and, more particularly, to methods of manufacturing integrated circuit capacitors.

BACKGROUND OF THE INVENTION

As integration density of integrated circuit devices increases, use of a dielectric layer having a high dielectric constant may be used to obtain high capacitance in a small space. The high dielectric constant material may be $Ta_2O_5$, $TiO_2$, $Al_2O_3$, $Y_2O_3$, $ZrO_2$, $HfO_2$, $BaTiO_3$, or $SrTiO_3$.

Although these oxide layers have a relatively high dielectric constant, they may react with polysilicon, which is a material commonly used as a lower electrode in conventional capacitors. For example, polysilicon may be oxidized by reacting with a tantalum oxide layer during a process of forming the tantalum oxide layer or during a thermal treatment process after formation of the tantalum oxide layer. To reduce oxidation, a nitride layer may be interposed between the tantalum oxide layer and the polysilicon and used as a barrier layer against diffusion of oxygen.

Another approach to reducing oxidation involves forming a lower electrode of a material that is relatively difficult to oxidize. For example, a noble metal, such as Pt, Ru, Ir or a conductive metal nitride, such as TiN may be used. FIG. 1 illustrates a Ru layer 110 that is formed on a silicon substrate 100 and thermally treated in an ozone ($O_3$) atmosphere at 250° C. As shown in FIG. 1, columnar crystal phases 120 exist on the surface of the Ru layer 110. These columnar crystal phases 120 are $RuO_2$, which is formed by oxidization of the Ru layer 110 due to ozone. These $RuO_2$ crystal phases 120 may inhibit formation of the dielectric layer (e.g., a tantalum oxide layer) and also deteriorate the properties of the capacitor by reducing the contact area between the Ru layer 110 and the dielectric layer. In particular, when the dielectric layer is formed on a substrate having a cylindrical opening, such as, for example, an opening for a cylindrical capacitor, the dielectric layer may not be formed on lower portions of the opening. As a result, step coverage of the dielectric layer may deteriorate.

SUMMARY OF THE INVENTION

According to embodiments of the present invention, an integrated circuit capacitor is manufactured by forming a lower electrode on a substrate and forming a metal preprocessed layer on the lower electrode using chemical vapor deposition in which a metal precursor is used as a source gas and the metal precursor comprises oxygen. A dielectric layer is then formed on the metal preprocessed layer and an upper electrode is formed on the dielectric layer. The metal preprocessed layer may reduce oxidation of the lower electrode due to oxygen supplied during formation of the dielectric layer.

In other embodiments of the present invention, the lower electrode comprises polysilicon, a noble metal, and/or a metal nitride.

In still other embodiments of the present invention, the metal precursor comprises $Ta(OCH_2H_5)_5$ or $Ta(OCH_3)_5$.

In still other embodiments of the present invention, the metal preprocessed layer is formed by placing the substrate into a reaction chamber, adsorbing the metal precursor in the lower electrode, reacting the metal precursor with the lower electrode, and purging the metal precursor from the reaction chamber.

In further embodiments of the present invention, the dielectric layer comprises a metal oxide layer, which is formed by placing the substrate into a reaction chamber, introducing a metal source gas into the reaction chamber, adsorbing the metal source gas in the lower electrode, purging the metal source gas from the reaction chamber, introducing an oxygen source gas into the reaction chamber, adsorbing the oxygen source gas in the lower electrode, and reacting the adsorbed metal source gas with the adsorbed oxygen source gas.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF PREFERRED EMBODIMENTS

Figure 1:
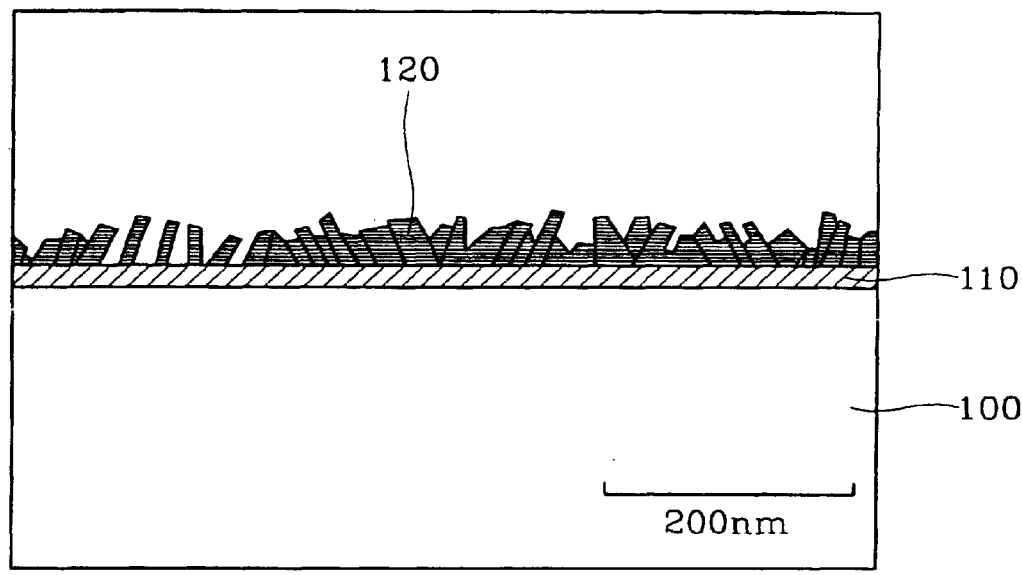
FIG. 1 illustrates a Ru layer that is formed on a silicon substrate and thermally treated in an ozone ($O_3$) atmosphere.

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like numbers refer to like elements throughout the description of the figures.

Figure 2:
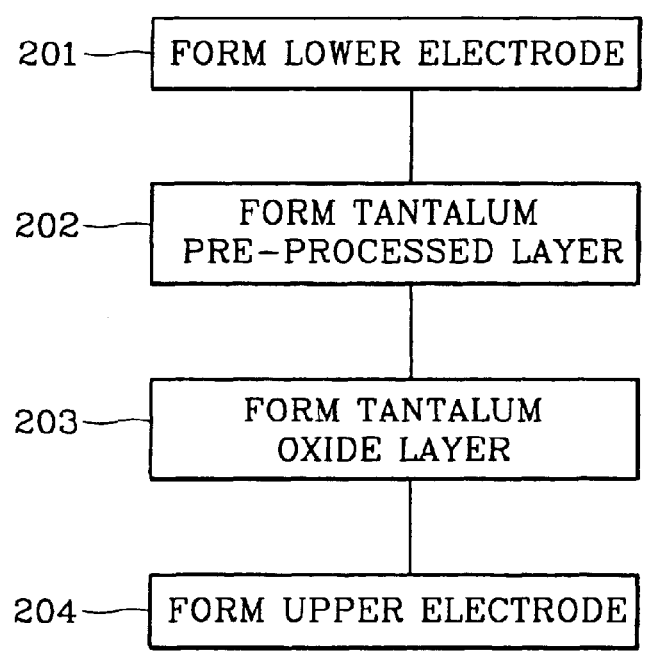
FIG. 2 is a flow chart that illustrates methods of forming an integrated circuit capacitor in which a metal preprocessed layer is formed on an electrode thereof in accordance with embodiments of the present invention.

FIG. 2 is a flow chart that illustrates operations for forming an integrated circuit capacitor in accordance with embodiments of the present invention. Operations begin at block 201 where a lower electrode, which comprises polysilicon, a noble metal, and/or a metal nitride is formed on an integrated circuit substrate. The noble metal may be Ru, Pt, or Ir. The metal nitride may be a single metal nitride, such as TiN, or a nitride comprising more than two metals, such as (Ti, Ta)N. The noble metal and the metal nitride may be deposited using chemical vapor deposition (CVD).

Next, a tantalum preprocessed layer is formed on the lower electrode at block 202. The tantalum preprocessed layer may be formed using CVD in which a metal precursor having a tantalum-oxygen bond is used as a source gas. The tantalum precursor having an oxygen bond may be $Ta(OC_2H_5)_5$ and/or $Ta(OCH_3)_5$. In accordance with other embodiments of the present invention, another metal preprocessed layer may be used instead of the tantalum preprocessed layer. For example, a titanium (Ti) preprocessed layer may be formed using a precursor such as $TiO(DPM)_2$ and/or $Ti(t-BuO)_2(DPM)_2$, and a zirconium (Zr) preprocessed layer may be formed using a precursor such as $Zr(OBu^t)_4$.

The tantalum preprocessed layer may be formed by general thermal CVD, atomic layer deposition, and sequential layer deposition using the tantalum precursor as a source gas. Atomic layer deposition is a type of CVD that involves chemisorbing a flowed source gas on the surface of a substrate, purging the remnant source gas, and forming a material layer comprising the chemisorbed source gas. The material layer may be formed to a desired thickness by repeating the cycle of inflow of the source gas and purging. Because the thickness of the material layer may be controlled at atomic layer unit precision, it may be possible to form a material layer having relatively good step coverage. Also, the density of impurities contained in the material layer may be relatively low. Sequential layer deposition may comprise atomic layer deposition along with forming a plurality of atomic layers during a cycle by controlling the flow rate of the source gas and the pressure of the reaction chamber so that the source gas may be chemically and physically adsorbed on the substrate. Hereinafter, atomic layer deposition is used in a broad sense to include sequential layer deposition.

For a capacitor having a three-dimensional structure, such as a cylindrical capacitor, atomic layer deposition may be used to uniformly form the tantalum preprocessed layer. Operations for forming a tantalum preprocessed layer, in accordance with embodiments of the present invention, will now be described in greater detail. An integrated circuit substrate having a lower electrode formed thereon that comprises a noble metal or a metal nitride is introduced into a reaction chamber. Next, a tantalum precursor, which includes oxygen as a source gas for forming a preprocessed layer, is introduced into the reaction chamber. The introduced tantalum precursor is chemically or physically adsorbed in the lower electrode and substrate. A purge gas is then introduced into the reaction chamber to purge the source gas remaining within the reaction chamber. The operations of introducing the source gas and purging are repeated to uniformly form the tantalum preprocessed layer on the lower electrode. The number of repetitions of the cycle can be controlled depending on the shape of the capacitor. For example, for a cylindrical capacitor that includes a cylindrical lower electrode having a high aspect ratio, it may be desirable to increase the number of repetitions of the cycle to uniformly form the tantalum preprocessed layer on the entire lower electrode.

The tantalum preprocessed layer reacts with oxygen included in the precursor to form an oxide layer. The rate of formation of the oxide layer is typically relatively low because oxidation is performed using only oxygen included in the tantalum precursor and not using an additional oxygen source. Even if the number of repetitions of the cycle is increased, however, the resultant thickness of the preprocessed layer may not change very much.

In accordance with embodiments of the present invention, the flow rate of the tantalum precursor during the deposition process may be about 1–2000 sccm. The purge gas may be nitrogen or argon, and the flow rate may be about 1–2000 sccm. The temperature of the reaction chamber may be maintained to be in a range of about 100–600° C., and the pressure of the reaction chamber may be maintained at about 0.1–30 torr.

After the tantalum preprocessed layer is formed, a tantalum oxide layer is formed on the tantalum preprocessed layer at block 203. The tantalum oxide layer may be formed by general thermal CVD or atomic layer deposition. The tantalum source gas for forming the tantalum oxide layer may be $Ta(OC_2H_5)_5$, $Ta(OCH_3)_5$, and/or $TaCl_5$, and the oxygen source gas may be $H_2O$, $H_2O_2$, $O_2$, $N_2O$, $O_3$, or a mixture of these gases.

For a capacitor having a three-dimensional structure, such as a cylindrical capacitor, it may be desirable to use atomic layer deposition to increase step coverage of the tantalum oxide layer. Exemplary operations for forming the tantalum oxide layer will now be described. First, the integrated circuit substrate on which the tantalum preprocessed layer is formed is introduced into the reaction chamber, and the tantalum source gas is introduced into the reaction chamber to be adsorbed on the substrate. After a predetermined time has passed, the tantalum source gas within the reaction chamber is purged, and the oxygen source gas is introduced into the reaction chamber to be adsorbed on the substrate. Next, the adsorbed tantalum source gas reacts with the adsorbed oxygen source gas to form the tantalum oxide layer.

In accordance with embodiments of the present invention, the flow rate of the tantalum precursor during the deposition process may be about 1–2000 sccm and the flow rate of the oxygen source gas may be about 1–2000 sccm. The purge gas may be nitrogen or an inert gas, such as argon, and the flow rate may be about 1–2000 sccm. The temperature of the reaction chamber may be maintained to be in a range of about 100–600° C., and a pressure of the chamber may be maintained to be about 0.1–10 torr.

Referring now to FIG. 2, an upper electrode is formed on the integrated circuit substrate on which the tantalum oxide layer is formed at block 204. The upper electrode may be a polysilicon layer, a metal nitride layer, such as TiN formed by CVD or atomic layer deposition, a noble metal layer, such as Ru, Ir, Pt, or a composite layer thereof.

EXAMPLE 1

The following example illustrates effects of preventing oxidation of a tantalum preprocessed layer in accordance with embodiments of the present invention.

After three flat silicon substrates were prepared, TEOS layers were formed on each of the silicon substrates, and Ru layers were formed on each of the TEOS layers to a thickness of about 300 Å. Next, tantalum preprocessed layers were formed on the Ru layers using $Ta(OC_2H_5)_5$ as a tantalum precursor. The tantalum preprocessed layers were formed by repeating a cycle of flowing $Ta(OC_2H_5)$s followed by purging using atomic layer deposition as described above. The cycle was repeated 10 times for one substrate, 100 times for another substrate, and 200 times for a third substrate.

Figure 3:
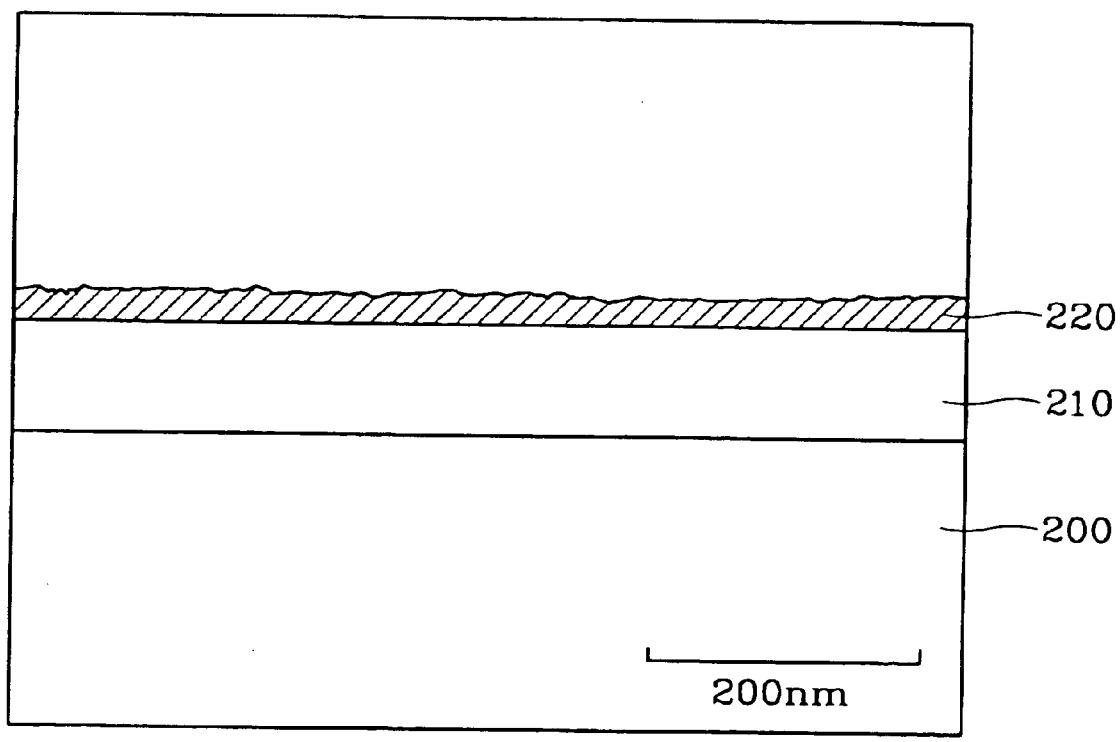
FIG. 3 illustrates a section of a Ru layer, which has a tantalum preprocessed layer formed thereon in accordance with embodiments of the present invention.

Next, the temperature of the reaction chamber was maintained to be about 250° C., and $O_3$ was flowed as an oxygen source on each of the integrated circuit substrates on which the preprocessed layer was formed. The Ru layers formed on each of the silicon substrates were oxidized, and sections of the integrated circuit substrates were observed with a scanning electron microscope (SEM). It was not possible to observe formation of $RuO_2$ on each of the Ru layers regardless of the number of repetitions of the cycle. For example, an SEM picture of a section of the substrate on which the cycle was repeated 100 times is illustrated in FIG. 3. The surface of the Ru layer 220 formed on the TEOS layer 210 of the silicon substrate 200 is relatively smooth, and, in contrast to the prior art example discussed above with reference to FIG. 1, a columnar $RuO_2$ layer is not formed on the surface of the Ru layer 220. The thickness of the preprocessed layer (not shown), which was formed on the surface of the Ru layer 220, was relatively thin (about 10 Å).

EXAMPLE 2

The following example illustrates that a dielectric layer having relatively good step coverage may be formed on a cylindrical lower electrode when the lower electrode comprises, for example, a tantalum preprocessed layer disposed on a Ru layer in accordance with embodiments of the present invention.

A TEOS insulating layer was formed and patterned on a silicon substrate to form a cylindrical opening having an aspect ratio of about 15. A Ru layer was formed on the insulating layer and a tantalum preprocessed layer was formed on the Ru layer by atomic layer deposition in which $Ta(OC_2H_5)_5$ was used as a source gas. The cycle of flowing the tantalum precursor gas followed by purging was repeated 100 times to form the preprocessed layer. Next, a tantalum oxide layer was formed on the resultant substrate at about 250° C. by atomic layer deposition using $Ta(OC_2H_5)_5$ as a tantalum source gas and $O_3$ as an oxygen source gas. A section of an opening formed on the substrate was observed with a SEM.

The operations described above for forming the TEOS layer, patterning the opening, forming the Ru layer, and forming the tantalum oxide layer were repeated on another substrate, but the tantalum preprocessed layer was not formed. A section of an opening formed on the substrate was also observed with the SEM.

Figure 4A:
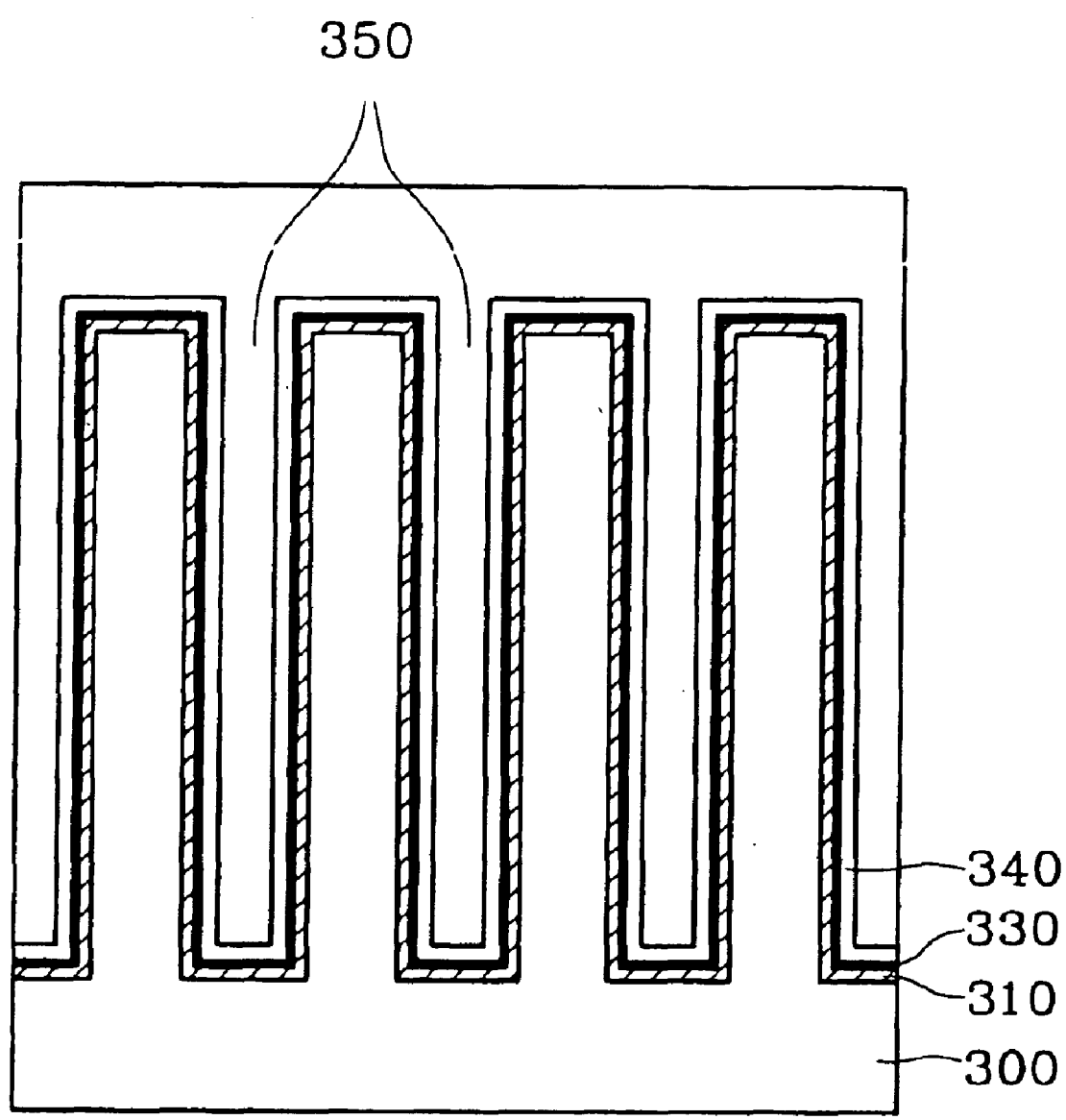
FIG. 4A illustrates a section of a tantalum oxide layer formed on a Ru layer having a tantalum preprocessed layer formed thereon in accordance with embodiments of the present invention.
Figure 4B:
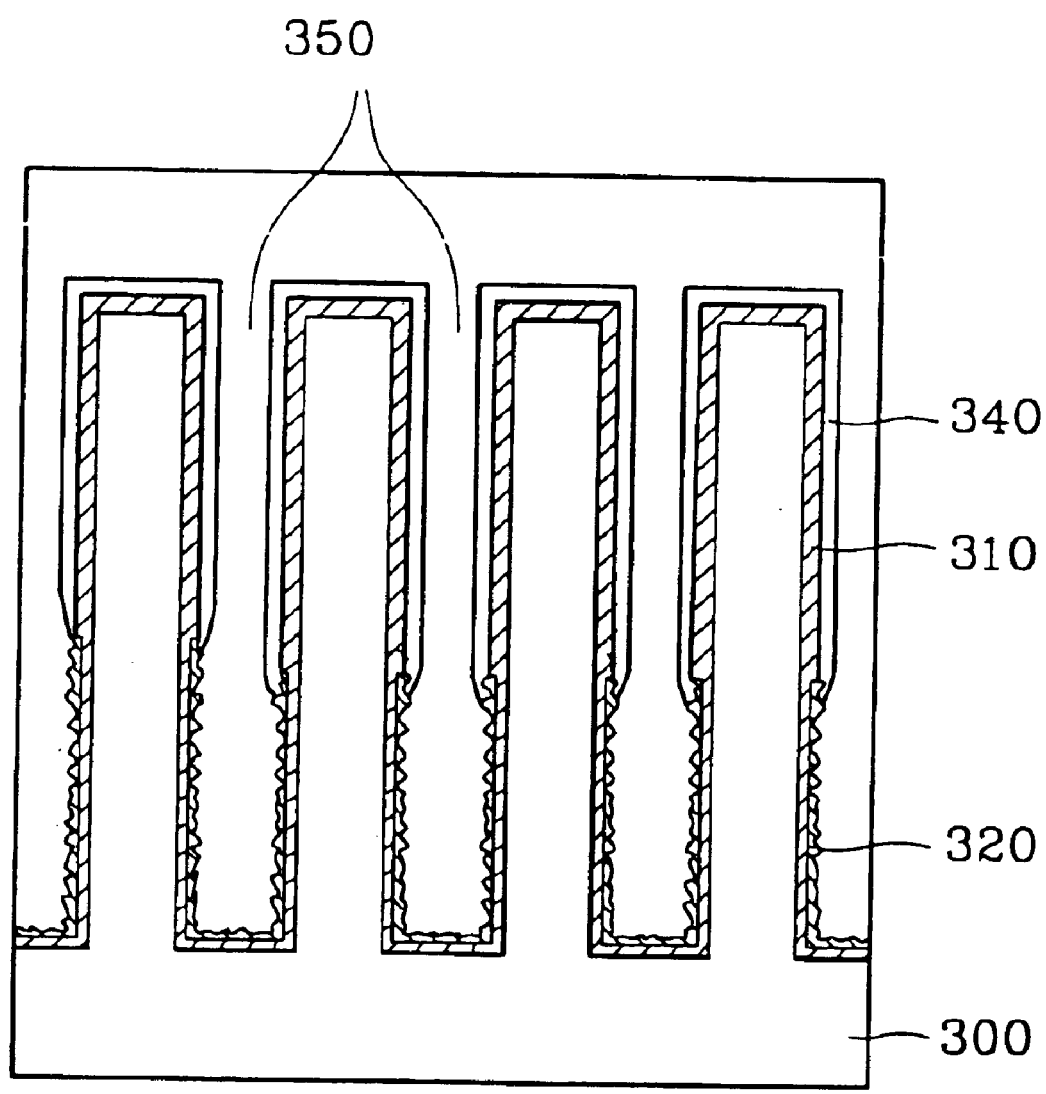
FIG. 4B illustrates a section of a tantalum oxide layer formed on a Ru layer without a tantalum preprocessed layer formed thereon.

FIGS. 4A and 4B illustrate typical SEM pictures of sections of openings formed on the substrate that underwent a process for forming the tantalum preprocessed layer and the substrate that did not undergo a process for forming the tantalum preprocessed layer, respectively. In FIGS. 4A and 4B, the same reference numerals represent the same elements.

Referring now to FIG. 4A, a tantalum preprocessed layer 330 on a Ru layer 310 allows a tantalum oxide layer 340 to be uniformly formed on an upper portion and a lower portion of an opening 350. On the other hand, referring now to FIG. 4B, the tantalum oxide layer 340 is not formed on lower portions of the opening 350. This is because columnar $RuO_2$ crystals 320 inhibit formation of the tantalum oxide layer 340. The TEOS layer is represented by reference numeral 300.

Thus, according to embodiments of the present invention, in an integrated circuit capacitor having a metal oxide layer as a dielectric layer, oxidation of a lower electrode due to oxygen supplied during formation of the metal oxide layer may be reduced by forming a metal preprocessed layer on a lower electrode of a polysilicon layer, a noble metal layer, or a metal nitride layer. In particular, in a capacitor having a three-dimensional structure and a large aspect ratio, deterioration of step coverage of the metal oxide layer, which may be caused by failure of the metal oxide layer to form on an oxidized portion of the electrode, may be reduced by uniformly forming the metal oxide layer on the surface of the lower electrode.

In concluding the detailed description, it should be noted that many variations and modifications can be made to the preferred embodiments without substantially departing from the principles of the present invention. All such variations and modifications are intended to be included herein within the scope of the present invention, as set forth in the following claims.

We claim:

1. A method comprising: forming an integrated circuit capacitor, which comprises:

forming a lower electrode on a substrate;

forming a metal preprocessed layer on the lower electrode using chemical vapor deposition in which a metal precursor comprising a material selected from a group of materials consisting of $Ta(OC_2H_5)_5$ and $Ta(OCH_3)_5$ is used as a source gas comprising:

placing the substrate into a reaction chamber;

adsorbing the metal precursor directly in the lower electrode;

reacting the metal precursor with the lower electrode; and purging the metal precursor from the reaction chamber, forming a dielectric layer on the metal preprocessed layer; and forming an upper electrode on the dielectric layer.

2. The method of claim 1, wherein the lower electrode comprises at least one material selected from group of materials consisting of polysilicon, a noble metal, and metal nitride.

3. The method of claim 2, wherein the noble metal is selected from a group of noble metals consisting of Ru, Pt, and Ir.

4. The method of claim 2, wherein the metal nitride is selected from a group of metal nitrides consisting of titanium nitride, tantalum nitride, and tungsten nitride.

5. The method of claim 1, wherein the metal precursor comprises Ta.

6. The method of claim 1, wherein a flow rate of the metal precursor during deposition is about 1–2000 sccm.

7. The method of claim 1, wherein a temperature in the reaction chamber is about 100° C.–600° C.

8. The method of claim 1, wherein purging the metal precursor comprises purging the metal precursor from the reaction chamber using a purge gas selected from a group of purge gases consisting of argon and nitrogen.

9. The method of claim 1, wherein a pressure in the reaction chamber is about 0.1–30 torr.

10. The mehod of claim 1, wherein the dielectric layer comprises a metal oxide layer.

11. The method of claim 1, wherein the upper electrode comprises at least one material selected from group of materials consisting of polysilicon; a noble metal, and metal nitride.

12. The method of claim 11, wherein the noble metal is selected from a group of noble metals consisting of Ru, Pt, and Ir.

13. The method of claim 11, wherein the metal nitride is selected from a group of metal nitrides consisting of titanium nitride, tantalum nitride, and tungsten nitride.

14. The method of claim 10, wherein forming the metal oxide layer comprises:

placing the substrate into a reaction chamber;

introducing a metal source gas into the reaction chamber;

adsorbing the metal source gas in the lower electrode;

purging the metal source gas from the reaction chamber;

introducing an oxygen source gas into the reaction chamber;

adsorbing the oxygen source gas in the lower electrode; and reacting the adsorbed metal source gas with the adsorbed oxygen source gas.

15. The method of claim 14, wherein the metal oxide layer comprises tantalum oxide.

16. The method of claim 14, wherein the metal source gas comprises a source gas selected from a group of source gases consisting of $Ta(OCH_2H_5)_5$, $Ta(OCH_3)_5$, and $TaCl_5$.

17. The method of claim 14, wherein the oxygen source gas comprises at least one source gas selected from a group of source gases consisting of $H_2O$, $H_2O_2$, $O_2$, $N_2O$, and $O_3$.

18. The method of claim 14, wherein a flow rate of the metal source gas and a flow rate of the oxygen source gas during deposition is about 1–2000 sccm.

19. The method of claim 14, wherein a temperature in the reaction chamber is about 100° C.–600° C.

20. The method of claim 14, wherein purging the metal source gas comprises purging the metal source gas from the reaction chamber using a purge gas selected from a group of purge gases consisting of argon and nitrogen.

21. The method of claim 14, wherein a pressure in the reaction chamber is about 0.1–10 torr.

* * * * *